(12) United States Patent
Li et al.

(10) Patent No.: US 9,009,557 B2
(45) Date of Patent: Apr. 14, 2015

(54) SYSTEMS AND METHODS FOR REUSING A LAYERED DECODER TO YIELD A NON-LAYERED RESULT

(71) Applicant: LSI Corporation, San Jose, CA (US)

(72) Inventors: Shu Li, San Jose, CA (US); Zongwang Li, Santa Clara, CA (US); Shaohua Yang, San Jose, CA (US); Fan Zhang, Milpitas, CA (US); Chung-Li Wang, San Jose, CA (US)

(73) Assignee: LSI Corporation, San Jose, CA (US)

( * ) Notice: Subject to any disclaimer, the term of this patent is extended or adjusted under 35 U.S.C. 154(b) by 62 days.

(21) Appl. No.: 13/746,301

(22) Filed: Jan. 21, 2013

(65) Prior Publication Data

US 2014/0208180 A1    Jul. 24, 2014

(51) Int. Cl.
*H03M 13/00* (2006.01)
*H03M 13/11* (2006.01)
*H03M 13/29* (2006.01)
*H03M 13/37* (2006.01)
*H03M 13/27* (2006.01)

(52) U.S. Cl.
CPC ........ *H03M 13/112* (2013.01); *H03M 13/1102* (2013.01); *H03M 13/1105* (2013.01); *H03M 13/1122* (2013.01); *H03M 13/1128* (2013.01); *H03M 13/114* (2013.01); *H03M 13/27* (2013.01); *H03M 13/2957* (2013.01); *H03M 13/3707* (2013.01); *H03M 13/3753* (2013.01); *H03M 13/6331* (2013.01); *H03M 13/6343* (2013.01); *H03M 13/658* (2013.01)

(58) Field of Classification Search
CPC ............................ H03M 13/13; H03M 13/112

USPC .................................................. 714/752, 795
See application file for complete search history.

(56) References Cited

U.S. PATENT DOCUMENTS

| | | |
|---|---|---|
| 4,553,221 A | 11/1985 | Hyatt |
| 5,278,703 A | 1/1994 | Rub et al. |
| 5,278,846 A | 1/1994 | Okayama |
| 5,317,472 A | 5/1994 | Schweitzer, III |
| 5,325,402 A | 6/1994 | Ushirokawa |
| 5,392,299 A | 2/1995 | Rhines |
| 5,417,500 A | 5/1995 | Martinie |
| 5,450,253 A | 9/1995 | Seki |
| 5,513,192 A | 4/1996 | Janku |
| 5,523,903 A | 6/1996 | Hetzler |
| 5,550,810 A | 8/1996 | Monogioudis et al. |
| 5,550,870 A | 8/1996 | Blaker |
| 5,612,964 A | 3/1997 | Haraszti |
| 5,710,784 A | 1/1998 | Kindred |
| 5,717,706 A | 2/1998 | Ikeda |

(Continued)

FOREIGN PATENT DOCUMENTS

| | | | |
|---|---|---|---|
| JP | 2001/319433 A | | 11/2001 |
| WO | WO 2010/059264 A1 | | 5/2010 |
| WO | WO 2010/126482 A1 | | 11/2010 |

OTHER PUBLICATIONS

U.S. Appl. No. 13/426,714, filed Mar. 22, 2012, Shaohua Yang.

(Continued)

*Primary Examiner* — Esaw Abraham
(74) *Attorney, Agent, or Firm* — Hamilton DeSanctis & Cha

(57) ABSTRACT

The present inventions are related to systems and methods for data processing, and more particularly to systems and methods for performing data decoding.

20 Claims, 7 Drawing Sheets

(56) References Cited

U.S. PATENT DOCUMENTS

| | | |
|---|---|---|
| 5,802,118 A | 9/1998 | Bliss |
| 5,844,945 A | 12/1998 | Nam |
| 5,898,710 A | 4/1999 | Amrany |
| 5,923,713 A | 7/1999 | Hatakeyama |
| 5,978,414 A | 11/1999 | Nara |
| 5,983,383 A | 11/1999 | Wolf |
| 6,005,897 A | 12/1999 | Mccallister |
| 6,023,783 A | 2/2000 | Divsalar |
| 6,029,264 A | 2/2000 | Kobayashi |
| 6,065,149 A | 5/2000 | Yamanaka |
| 6,097,764 A | 8/2000 | McCallister |
| 6,145,110 A | 11/2000 | Khayrallah |
| 6,216,249 B1 | 4/2001 | Bliss |
| 6,216,251 B1 | 4/2001 | McGinn |
| 6,266,795 B1 | 7/2001 | Wei |
| 6,317,472 B1 | 11/2001 | Choi |
| 6,351,832 B1 | 2/2002 | Wei |
| 6,377,610 B1 | 4/2002 | Hagenauer |
| 6,381,726 B1 | 4/2002 | Weng |
| 6,412,088 B1 | 6/2002 | Patapoutian |
| 6,473,878 B1 | 10/2002 | Wei |
| 6,535,553 B1 | 3/2003 | Limberg |
| 6,625,775 B1 | 9/2003 | Kim |
| 6,748,034 B2 | 6/2004 | Hattori |
| 6,757,862 B1 | 6/2004 | Marianetti, II |
| 6,785,863 B2 | 8/2004 | Blankenship |
| 6,810,502 B2 | 10/2004 | Eidson |
| 6,970,511 B1 | 11/2005 | Barnette |
| 6,975,692 B2 | 12/2005 | Razzell |
| 6,986,098 B2 | 1/2006 | Poeppelman |
| 7,035,327 B2 | 4/2006 | Nakajima |
| 7,047,474 B2 | 5/2006 | Rhee |
| 7,058,873 B2 | 6/2006 | Song et al. |
| 7,073,118 B2 | 7/2006 | Greenberg |
| 7,093,179 B2 | 8/2006 | Shea |
| 7,117,427 B2 | 10/2006 | Ophir |
| 7,133,228 B2 | 11/2006 | Fung |
| 7,136,244 B1 | 11/2006 | Rothberg |
| 7,184,486 B1 | 2/2007 | Wu |
| 7,191,378 B2 | 3/2007 | Eroz |
| 7,203,887 B2 | 4/2007 | Eroz |
| 7,237,181 B2 | 6/2007 | Richardson |
| 7,308,061 B1 | 12/2007 | Huang |
| 7,310,768 B2 | 12/2007 | Eidson |
| 7,313,750 B1 | 12/2007 | Feng |
| 7,370,258 B2 | 5/2008 | Iancu |
| 7,415,651 B2 | 8/2008 | Argon |
| 7,502,189 B2 | 3/2009 | Sawaguchi |
| 7,523,375 B2 | 4/2009 | Spencer |
| 7,587,657 B2 | 9/2009 | Haratsch |
| 7,590,168 B2 | 9/2009 | Raghavan |
| 7,596,196 B1 | 9/2009 | Liu et al. |
| 7,630,431 B2 * | 12/2009 | Konz et al. ............... 375/219 |
| 7,646,829 B2 | 1/2010 | Ashley |
| 7,702,986 B2 | 4/2010 | Bjerke |
| 7,752,523 B1 | 7/2010 | Chaichanavong |
| 7,779,325 B2 | 8/2010 | Song |
| 7,802,172 B2 | 9/2010 | Casado |
| 7,952,824 B2 | 5/2011 | Dziak |
| 7,958,425 B2 | 6/2011 | Chugg |
| 7,996,746 B2 | 8/2011 | Livshitz |
| 8,018,360 B2 | 9/2011 | Nayak |
| 8,020,078 B2 | 9/2011 | Richardson |
| 8,161,361 B1 | 4/2012 | Song et al. |
| 8,194,796 B2 * | 6/2012 | Collins et al. ............. 375/340 |
| 8,201,051 B2 | 6/2012 | Tan |
| 8,225,168 B2 | 7/2012 | Yu et al. |
| 8,237,597 B2 | 8/2012 | Liu |
| 8,261,171 B2 | 9/2012 | Annampedu |
| 8,291,284 B2 | 10/2012 | Savin |
| 8,291,299 B2 | 10/2012 | Ii |
| 8,295,001 B2 | 10/2012 | Liu |
| 8,504,890 B2 * | 8/2013 | Sharon et al. ............. 714/758 |
| 8,504,892 B2 * | 8/2013 | Heinrich et al. ............ 714/758 |
| 8,549,375 B2 * | 10/2013 | Ueng et al. ............... 714/752 |
| 8,601,328 B1 * | 12/2013 | Varnica et al. ............. 714/714 |
| 2002/0067780 A1 | 6/2002 | Razzell |
| 2003/0123364 A1 | 7/2003 | Nakajima et al. |
| 2003/0147168 A1 | 8/2003 | Galbraith et al. |
| 2004/0194007 A1 | 9/2004 | Hocevar |
| 2005/0243456 A1 | 11/2005 | Mitchell et al. |
| 2006/0002689 A1 | 1/2006 | Yang et al. |
| 2007/0297496 A1 | 12/2007 | Park et al. |
| 2008/0037676 A1 | 2/2008 | Kyun et al. |
| 2008/0069373 A1 | 3/2008 | Jiang |
| 2008/0304558 A1 | 12/2008 | Zhu et al. |
| 2009/0132893 A1 | 5/2009 | Miyazaki |
| 2009/0177852 A1 | 7/2009 | Chen |
| 2009/0185643 A1 | 7/2009 | Fitzpatrick |
| 2010/0172046 A1 | 7/2010 | Liu et al. |
| 2010/0322048 A1 | 12/2010 | Yang et al. |
| 2011/0167227 A1 | 7/2011 | Yang |
| 2011/0264987 A1 | 10/2011 | Li |
| 2012/0124118 A1 | 5/2012 | Ivkovic |
| 2012/0182643 A1 | 7/2012 | Zhang |
| 2012/0207201 A1 | 8/2012 | Xia |
| 2012/0212849 A1 | 8/2012 | Xu |
| 2012/0262814 A1 | 10/2012 | Li |
| 2012/0265488 A1 | 10/2012 | Sun |

OTHER PUBLICATIONS

Casado et al., Multiple-rate low- density parity-check codes with constant blocklength, IEEE Transations on communications, Jan. 2009, vol. 57, pp. 75-83.

Cui et al., "High-Throughput Layered LDPC Decoding Architecture", IEEE Transactions on Very Large Scale Integration (VLSI) Systems, vol. 17, No. 4 (Apr. 2009).

Fan et al., "Constrained coding techniques for soft iterative decoders" Proc. IEEE Global Telecommun. Conf., vol. 1b, pp. 631-637 (1999).

Fossorier, Marc P.C. "Quasi-Cyclic Low-Density Parity-Check Codes From Circulant Permutation Maricies" IEEE Transactions on Information Theory, vol. 50, No. 8 Aug. 8, 2004.

Gross, "Stochastic Decoding of LDPC Codes over GF(q)", HDPCC Workshop, Tel Aviv (Mar. 2, 2010).

Gunnam et al., "VLSI Architectures for Layered Decoding for Irregular LDPC Codes of WiMax", IEEE ICC Proceedings (2007).

Hagenauer, J. et al A Viterbi Algorithm with Soft-Decision Outputs and its Applications in Proc. IEEE Globecom, pp. 47. 11-47 Dallas, TX Nov. 1989.

Han and Ryan, "Pinning Techniques for Low-Floor Detection/Decoding of LDPC-Coded Partial Response Channels", 5th International Symposium on Turbo Codes &Related Topics, 2008.

Kautz, "Fibonacci Codes for Synchronization Control", IEEE Trans. Info. Theory, vol. 11, No. 2, pp. 284-292 (Apr. 1965).

Kschischang et al., "Factor Graphs and the Sum-Product Algorithm", IEEE Transactions on Information Theory, vol. 47, No. 2 (Feb. 2001).

Leduc-Primeau et al., "A Relaxed Half-Stochastic Iterative Decoder for LDPC Codes", IEEE Communications Society, IEEE Globecom proceedings (2009).

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Li et al "Efficient Encoding of Quasi-Cyclic Low-Density Parity Check Codes" IEEE Transactions on Communications on 53 (11) 1973-1973, 2005.

Lim et al. "Convergence Analysis of Constrained Joint Adaptation in Recording Channels" IEEE Trans. on Signal Processing vol. 54, No. 1 Jan. 2006.

Lin et al "An efficient VLSI Architecture for non binary LDPC decoders"—IEEE Transaction on Circuits and Systems II vol. 57, Issue 1 (Jan. 2010) pp. 51-55.

Moon et al, "Pattern-dependent noise prediction in signal-dependent Noise," IEEE JSAC, vol. 19, No. 4 pp. 730-743, Apr. 2001.

Moon et al., "Maximum transition run codes for data storage systems", IEEE Trans. Magn., vol. 32, No. 5, pp. 3992-3994 (Sep. 1996).

Patapoutian et al "Improving Re-Read Strategies by Waveform Averaging" IEEE Transactions on Mag. vol. 37 No. 6, Nov. 2001.

Richardson, T "Error Floors of LDPC Codes" Flarion Technologies Bedminster NJ 07921, tjr@flarion.com (not dated).

(56) References Cited

OTHER PUBLICATIONS

Shokrollahi "LDPC Codes: An Introduction", Digital Fountain, Inc. (Apr. 2, 2003).
Spagnol et al, "Hardware Implementation of GF(2^m) LDPC Decoders", IEEE Transactions on Circuits and Systemsši : Regular Papers, vol. 56, No. 12 (Dec. 2009).
Tehrani et al., "Fully Parallel Stochastic LDPC Decoders", IEEE Transactions on Signal Processing, vol. 56, No. 11 (Nov. 2008).
Todd et al., "Enforcing maximum-transition-run code constraints and low-density parity check decoding", IEEE Trans. Magn., vol. 40, No. 6, pp. 3566-3571 (Nov. 2004).
U.S. Appl. No. 13/296,022, filed Nov. 14, 2011, Victor Krachkovsky, Unpublished.
U.S. Appl. No. 13/239,683, filed Sep. 22, 2011, Changyou Xu, Unpublished.
U.S. Appl. No. 13/186,234, filed Jul. 19, 2011, Haitao Xia, Unpublished.
U.S. Appl. No. 13/283,549, filed Oct. 27, 2011, Wu Chang, Unpublished.
U.S. Appl. No. 13/300,078, filed Nov. 18, 2011, Chung-Li Wang, Unpublished.
U.S. Appl. No. 13/302,119, filed Nov. 22, 2011, Lei Chen, Unpublished.
U.S. Appl. No. 13/305,510, filed Nov. 28, 2011, Lei Chen, Unpublished.
U.S. Appl. No. 13/305,551, filed Nov. 28, 2011, Yang Han, Unpublished.
U.S. Appl. No. 13/174,537, filed Jun. 30, 2011, Anantha Raman Krishnan, Unpublished.
U.S. Appl. No. 13/174,453, filed Jun. 30, 2011, Johnson Yen, Unpublished.
U.S. Appl. No. 13/171,615, filed Jun. 29, 2011, Bradley D. Seago, Unpublished.
U.S. Appl. No. 13/113,219, filed May 23, 2011, Yang Han, Unpublished.
U.S. Appl. No. 13/227,544, filed Sep. 8, 2011, Shaohua Yang, Unpublished.
U.S. Appl. No. 13/213,751, filed Aug. 19, 2011, Fan Zhang, Unpublished.
U.S. Appl. No. 13/227,416, filed Sep. 7, 2011, Lei Chen, Unpublished.
U.S. Appl. No. 13/415,430, filed Mar. 8, 2012, Nayak Ratnakar Aravind, Unpublished.
U.S. Appl. No. 13/545,833, filed Jul. 10, 2012, Zhi Bin Li, Unpublished.
U.S. Appl. No. 13/269,832, filed Oct. 10, 2011, Haitao Xia, Unpublished.
U.S. Appl. No. 13/596,947, filed Aug. 28, 2012, Fan Zhang, Unpublished.
U.S. Appl. No. 13/180,495, filed Jul. 11, 2011, Chung-Li Wang, Unpublished.
U.S. Appl. No. 13/596,978, filed Aug. 28, 2012, Fan Zhang, Unpublished.
U.S. Appl. No. 13/597,001, filed Aug. 28, 2012, Fan Zhang, Unpublished.
U.S. Appl. No. 13/433,693, filed Mar. 29, 2012, Fan Zhang, Unpublished.
U.S. Appl. No. 13/621,341, filed Sep. 17, 2012, Shaohua Yang, Unpublished.
U.S. Appl. No. 13/596,819, filed Aug. 28, 2012, Shaohua Yang, Unpublished.
U.S. Appl. No. 13/415,326, filed Mar. 8, 2012, Shaohua Yang, Unpublished.
U.S. Appl. No. 13/989,583, filed Oct. 15, 2012, Shaohua Yang, Unpublished.
U.S. Appl. No. 13/483,100, filed May 30, 2012, Fan Zhang, Unpublished.
U.S. Appl. No. 13/483,105, filed May 30, 2012, Xuebin Wu, Unpublished.
U.S. Appl. No. 13/426,693, filed Mar. 22, 2012, Shaohua Yang, Unpublished.
U.S. Appl. No. 13/705,407, filed Dec. 5, 2012, Lingyan Sun, Unpublished.
U.S. Appl. No. 13/652,012, filed Oct. 15, 2012, Fan Zhang, Unpublished.
U.S. Appl. No. 13/619,907, filed Sep. 14, 2012, Fan Zhang, Unpublished.
U.S. Appl. No. 13/284,730, filed Oct. 28, 2011, Fan Zhang, Unpublished.
U.S. Appl. No. 13/316,741, filed Dec. 12, 2011, Yang Han, Unpublished.
U.S. Appl. No. 13/327,279, filed Dec. 15, 2011, Wei Feng, Unpublished.
U.S. Appl. No. 13/340,974, filed Dec. 30, 2011, Dan Liu, Unpublished.
U.S. Appl. No. 13/474,660, filed May 17, 2012, Zongwang Li, Unpublished.
U.S. Appl. No. 13/445,848, filed Apr. 12, 2012, Bruce Wilson, Unpublished.
U.S. Appl. No. 13/340,951, filed Dec. 30, 2011, Lei Chen, Unpublished.
U.S. Appl. No. 13/445,878, filed Apr. 12, 2012, Yu Liao, Unpublished.
U.S. Appl. No. 13/269,852, filed Oct. 10, 2011, Haitao Xia, Unpublished.
U.S. Appl. No. 13/316,858, filed Dec. 12, 2011, Zongwang Li, Unpublished.
U.S. Appl. No. 13/295,150, filed Nov. 14, 2011, Zongwang Li, Unpublished.
U.S. Appl. No. 13/362,409, filed Jan. 31, 2012, Fan Zhang, Unpublished.
U.S. Appl. No. 13/412,520, filed Mar. 5, 2012, Fan Zhang, Unpublished.
U.S. Appl. No. 13/426,714, filed Mar. 22, 2012, Shaohua Yang, Unpublished.
U.S. Appl. No. 13/372,580, filed Feb. 14, 2012, Fan Zhang, Unpublished.
U.S. Appl. No. 13/422,986, filed Mar. 16, 2012, Fan Zhang, Unpublished.
U.S. Appl. No. 13/284,767, filed Oct. 28, 2011, Fan Zhang, Unpublished.
U.S. Appl. No. 13/369,468, filed Feb. 9, 2012, Zongwang Li, Unpublished.
Vasic, B., "High-Rate Girth-Eight Codes on Rectangular Integer Lattices", IEEE Trans. Communications, vol. 52, Aug. 2004, pp. 1248-1252.
Vasic, B., "High-Rate Low-Density Parity-Check Codes Based on Anti-Pasch Affine Geometries," Proc ICC 2002, pp. 1332-1336.
Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.
Xiao, et al "Nested Codes With Multiple Interpretations" retrieved from the Internet URL: http://www.ece.nmsu.edu/~jkliewer/paper/XFKC_CISS06 (retrieved on Dec. 5, 2012).
Yeo et al., "VLSI Architecture for Iterative Decoders in Magnetic Storage Channels", Mar. 2001, pp. 748-755, IEEE trans. Magnetics, vol. 37, No. 2.
Zhang et al., "Analysis of Verification-Based Decoding on the q-ary Symmetric Channel for Large q", IEEE Trans. On Information Theory, vol. 57, No. 10 (Oct. 2011).
Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.
Zhong et al., "Design of VLSI Implementation-Oriented LDPC Codes", IEEE, pp. 670-673, 2003.
Zhong et al., "High-Rate Quasi-Cyclic LDPC Codes for Magnetic Recording Channel with Low Error Floor", ISCAS, IEEE pp. 3546-3549, May 2006.
Zhong et al., "Joint Code-Encoder Design for LDPC Coding System VLSI Implementation", ISCAS, IEEE pp. 389-392, May 2004.
Zhong, "Block-LDPC: A Practical LDPC Coding System Design Approach", IEEE Trans. On Circuits, Regular Papers, vol. 5, No. 4, pp. 766-775, Apr. 2005.

\* cited by examiner

SYSTEMS AND METHODS FOR REUSING A LAYERED DECODER TO YIELD A NON-LAYERED RESULT

FIELD OF THE INVENTION

The present inventions are related to systems and methods for data processing, and more particularly to systems and methods for performing data decoding.

BACKGROUND

Various data processing systems have been developed including storage systems, cellular telephone systems, and radio transmission systems. In such systems data is transferred from a sender to a receiver via some medium. For example, in a storage system, data is sent from a sender (i.e., a write function) to a receiver (i.e., a read function) via a storage medium. As information is stored and transmitted in the form of digital data, errors are introduced that, if not corrected, can corrupt the data and render the information unusable. Layered data decoding techniques have been developed to overcome any corruption. In some cases, however, such layered decoding fails to properly decode.

Hence, for at least the aforementioned reasons, there exists a need in the art for advanced systems and methods for data decoding.

BRIEF SUMMARY

The present inventions are related to systems and methods for data processing, and more particularly to systems and methods for performing data decoding Various embodiments of the present invention provide data processing systems that include a data decoder selectably configured to operate either as a layered data decoder circuit or a non-layered data decoder circuit. Other embodiments of the present invention provide data processing systems that include a dual pass data decoder circuit. The dual pass data decoder circuit is operable to: access a data set from a memory for a first pass through the dual pass data decoder circuit; update a check node to variable node message based at least in part on the data set during the first pass; re-access the data set from the memory for a second pass through the dual pass data decoder circuit; and apply the check node to variable node message during the second pass to yield an output.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phases do not necessarily refer to the same embodiment. Many other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

Figure 1:
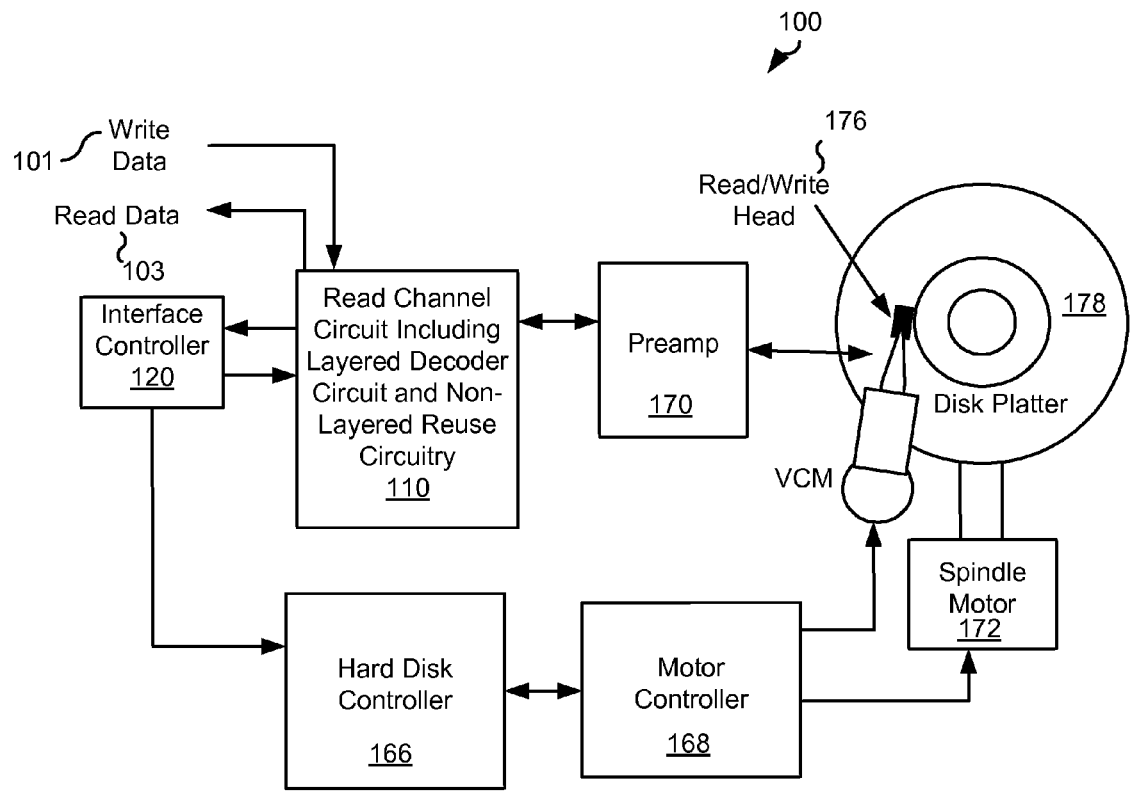
FIG. 1 shows a storage system including a read channel circuit having a layered decoder circuit and non-layered reuse circuitry in accordance with various embodiments of the present invention.

The present inventions are related to systems and methods for data processing, and more particularly to systems and methods for performing data decoding.

Various embodiments of the present invention provide data processing systems that include a data decoder selectably configured to operate either as a layered data decoder circuit or a non-layered data decoder circuit. As is known in the art, layered decoding can reduce the time to converge on a result in the decoder in some cases. As an example, at the beginning of each local decoding iteration in a layered decoding algorithm, the number of unsatisfied parity checks are calculated for each layer of an H matrix, and the results are sorted. In some embodiments, the number of unsatisfied parity checks for each layer are sorted in descending order, with the layer having the most unsatisfied parity checks being first. The layer processing order is thus determined dynamically for each decoding iteration based at least in part on the number of unsatisfied parity checks. By processing the layers with the most unsatisfied parity checks first, convergence speed is improved, because the unsatisfied check nodes provide the messages that correct the errors. The layers (or rows) of the H matrix are processed in the sorted order. The processing of each row may begin before the processing is complete for the previous layer. In order to prevent delays due to inter-layer dependencies, the circulants in a layer that have no dependencies to the previous layer are processed before the circulants that are dependent on the previous layer, thereby reducing processing latency. Non-layered decoding is a more standard approach that does not rely on changing the order of layer processing. In some instances of the aforementioned embodiments, the data processing system is implemented as an integrated circuit. The aforementioned systems may be implemented as part of a storage device, or a data transmission device.

In some instances of the aforementioned embodiments, the layered data decoder circuit is a layered low density parity check decoder circuit, and the non-layered data decoder circuit is a non-layered low density parity check decoder circuit. In various instances of the aforementioned embodiments, the data processing system further includes: a data detector circuit operable to apply a data detection algorithm to a data input to yield a decoder input. In such instances, the data decoder circuit applies the selected one of the layered data decoder circuit or the non-layered data decoder circuit to the decoder input to yield a decoded output. The data detector circuit may be, but is not limited to, a Viterbi algorithm data detector circuit, or a maximum a posteriori data detector circuit.

In some instances of the aforementioned embodiments, the data decoder circuit includes: a first selector circuit, a second selector circuit, and a third selector circuit. The first selector circuit is operable to select between a first codeword and a second codeword to provide a decoder input. The second codeword was processed by a preceding local iteration through the data decoder circuit. The second selector circuit is operable to select between a first value and a check node to variable node new message as a first summation input. The third selector circuit is operable to select between a second value and a check node to variable node old message as a second summation input. Selectably configuring the data decoder circuit is controlled at least in part based upon controlling selections by the first selector circuit, the second selector circuit, and the third selector circuit. In some cases, the first value and the second value are zero. In one or more cases, the data decoder circuit further includes: a first summation circuit, a second summation circuit, and a shifter circuit. The first summation circuit is operable to add the decoder input to the first summation input to yield a first sum. The shifter circuit is operable to apply a circulant shift to the first sum to yield a shifted output. The second summation circuit is operable to subtract the second summation input from the shifted output. In various cases, the data decoder circuit further includes a check node to variable node updating circuit operable to update the check node to variable node old message and the check node to variable node new message.

Other embodiments of the present invention provide data processing systems that include a dual pass data decoder circuit. The dual pass data decoder circuit is operable to: access a data set from a memory for a first pass through the dual pass data decoder circuit; update a check node to variable node message based at least in part on the data set during the first pass; re-access the data set from the memory for a second pass through the dual pass data decoder circuit; and apply the check node to variable node message during the second pass to yield an output.

In some instances of the aforementioned embodiments, the data decoder circuit includes a first selector circuit, a second selector circuit, and a third selector circuit. The first selector circuit is operable to select between a first codeword and a second codeword to provide a decoder input. The second codeword was processed by a preceding local iteration through the data decoder circuit. The second selector circuit is operable to select between a first value and a check node to variable node new message as a first summation input. The third selector circuit is operable to select between a second value and a check node to variable node old message as a second summation input. In some cases, the first value and the second value are zero. In one or more cases, the data decoder circuit further includes: a first summation circuit, a second summation circuit, and a shifter circuit. The first summation circuit is operable to add the decoder input to the first summation input to yield a first sum. The shifter circuit is operable to apply a circulant shift to the first sum to yield a shifted output. The second summation circuit is operable to subtract the second summation input from the shifted output. In various cases, the data decoder circuit further includes a check node to variable node updating circuit operable to update the check node to variable node old message and the check node to variable node new message. In some cases, the data decoder circuit is operable to: select the first codeword via the first selector circuit as the decoder input during the first pass and the second pass; select the first value via the second selector circuit as the first summation input during the first pass; select the check node to variable node new message via the second selector circuit as the first summation input during the second pass; and select the second value via the third selector circuit as the second summation input during the first pass and the second pass. In other cases, the data decoder circuit is operable to: select the second codeword via the first selector circuit as the decoder input during the first pass; select the first codeword via the first selector circuit as the decoder input during the second pass; select the first value via the second selector circuit as the first summation input during the first pass; select the check node to variable node new message via the second selector circuit as the first summation input during the second pass; select the check node to variable node old message via the third selector circuit as the second summation input during the first pass; and select the second value via the third selector circuit as the second summation input during the second pass.

Yet other embodiments of the present invention provide methods for data processing. The methods include providing a data decoder circuit selectably configurable to operate as either a layered data decoder circuit, or a non-layered data decoder circuit. The methods further include: configuring the data decoder circuit to operate as a layered data decoder circuit; applying a layered data decoding algorithm to a data set using the layered data decoder circuit; determining a failure of convergence of the layered data decoder circuit; re-configuring the data decoder circuit to operate as a non-layered data decoder circuit; and applying a non-layered data decoding algorithm to a data set using the non-layered data decoder circuit.

Turning to FIG. 1, a storage system 100 including a read channel circuit 110 having a layered decoder circuit and non-layered reuse circuitry in accordance with various embodiments of the present invention. Storage system 100 may be, for example, a hard disk drive. Storage system 100 also includes a preamplifier 170, an interface controller 120, a hard disk controller 166, a motor controller 168, a spindle motor 172, a disk platter 178, and a read/write head 176. Interface controller 120 controls addressing and timing of data to/from disk platter 178. The data on disk platter 178 consists of groups of magnetic signals that may be detected by read/write head assembly 176 when the assembly is properly positioned over disk platter 178. In one embodiment, disk platter 178 includes magnetic signals recorded in accordance with either a longitudinal or a perpendicular recording scheme.

In a typical read operation, read/write head assembly 176 is accurately positioned by motor controller 168 over a desired data track on disk platter 178. Motor controller 168 both positions read/write head assembly 176 in relation to disk platter 178 and drives spindle motor 172 by moving read/write head assembly to the proper data track on disk platter 178 under the direction of hard disk controller 166. Spindle motor 172 spins disk platter 178 at a determined spin rate (RPMs). Once read/write head assembly 176 is positioned adjacent the proper data track, magnetic signals representing data on disk platter 178 are sensed by read/write head assembly 176 as disk platter 178 is rotated by spindle motor 172. The sensed magnetic signals are provided as a continuous, minute analog signal representative of the magnetic data on disk platter 178. This minute analog signal is transferred from read/write head assembly 176 to read channel circuit 110 via preamplifier 170. Preamplifier 170 is operable to amplify the minute analog signals accessed from disk platter 178. In turn, read channel circuit 110 decodes and digitizes the received analog signal to recreate the information originally written to disk platter 178. This data is provided as read data 103 to a receiving circuit. A write operation is substantially the opposite of the preceding read operation with write data 101 being provided to read channel circuit 110. This data is then encoded and written to disk platter 178.

As part of processing the received information, read channel circuit 110 utilizes one or both of a layered decoding process or a non-layered decoding process. When layered decoding is desired, the layered decoder circuit is used in a standard way to perform layered decoding. Alternatively, when non-layered decoding is desired, the layered decoder circuit is re-configured for reuse as a non-layered decoder. In some cases, layered decoding is applied in an attempt to recover an originally written data set. When the layered decoding is unable to yield the originally written data set, the layered decoder circuit is re-configured for reuse as a non-layered decoder. Non-layered decoding is then applied to the same codeword in an attempt to yield the originally written data set. In some cases, read channel circuit 110 may be implemented to include a data processing circuit similar to that discussed below in relation to FIG. 3. The data processing circuit includes a layered decoder circuit including non-layered reuse circuitry. Such a layered decoder circuit including non-layered reuse circuitry may be written similar to that discussed below in relation to FIG. 4. In one or more embodiments of the present invention, the layered/non-layered decoding may be performed similar to that discussed below in relation to FIGS. 6a-6b.

It should be noted that storage system 100 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 100, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

A data decoder circuit used in relation to read channel circuit 110 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

In addition, it should be noted that storage system 100 may be modified to include solid state memory that is used to store data in addition to the storage offered by disk platter 178. This solid state memory may be used in parallel to disk platter 178 to provide additional storage. In such a case, the solid state memory receives and provides information directly to read channel circuit 110. Alternatively, the solid state memory may be used as a cache where it offers faster access time than that offered by disk platted 178. In such a case, the solid state memory may be disposed between interface controller 120 and read channel circuit 110 where it operates as a pass through to disk platter 178 when requested data is not available in the solid state memory or when the solid state memory does not have sufficient storage to hold a newly written data set. Based upon the disclosure provided herein, one of ordinary skill in the art will recognize a variety of storage systems including both disk platter 178 and a solid state memory.

Figure 2:
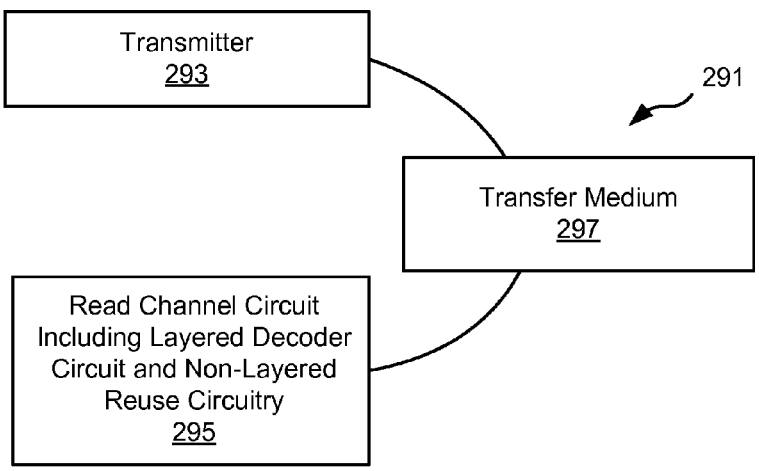
FIG. 2 depicts a data transmission system including a layered decoder circuit and non-layered reuse circuitry in accordance with one or more embodiments of the present invention.

Turning to FIG. 2, a data transmission system 291 including a receiver 295 having a layered decoder circuit and non-layered reuse circuitry in accordance with one or more embodiments of the present invention. Data transmission system 291 includes a transmitter 293 that is operable to transmit encoded information via a transfer medium 297 as is known in the art. The encoded data is received from transfer medium 297 by a receiver 295. Receiver 295 processes the received input to yield the originally transmitted data.

As part of processing the received information, receiver 295 utilizes one or both of a layered decoding process or a non-layered decoding process. When layered decoding is desired, the layered decoder circuit is used in a standard way to perform layered decoding. Alternatively, when non-layered decoding is desired, the layered decoder circuit is re-configured for reuse as a non-layered decoder. In some cases, layered decoding is applied in an attempt to recover an originally written data set. When the layered decoding is unable to yield the originally written data set, the layered decoder circuit is re-configured for reuse as a non-layered decoder. Non-layered decoding is then applied to the same codeword in an attempt to yield the originally written data set. In some cases, read receiver 295 may be implemented to include a data processing circuit similar to that discussed below in relation to FIG. 3. The data processing circuit includes a layered decoder circuit including non-layered reuse circuitry. Such a layered decoder circuit including non-layered reuse circuitry may be written similar to that discussed below in relation to FIG. 4. In one or more embodiments of the present invention, the layered/non-layered decoding may be performed similar to that discussed below in relation to FIGS. 6a-6b.

Figure 3:
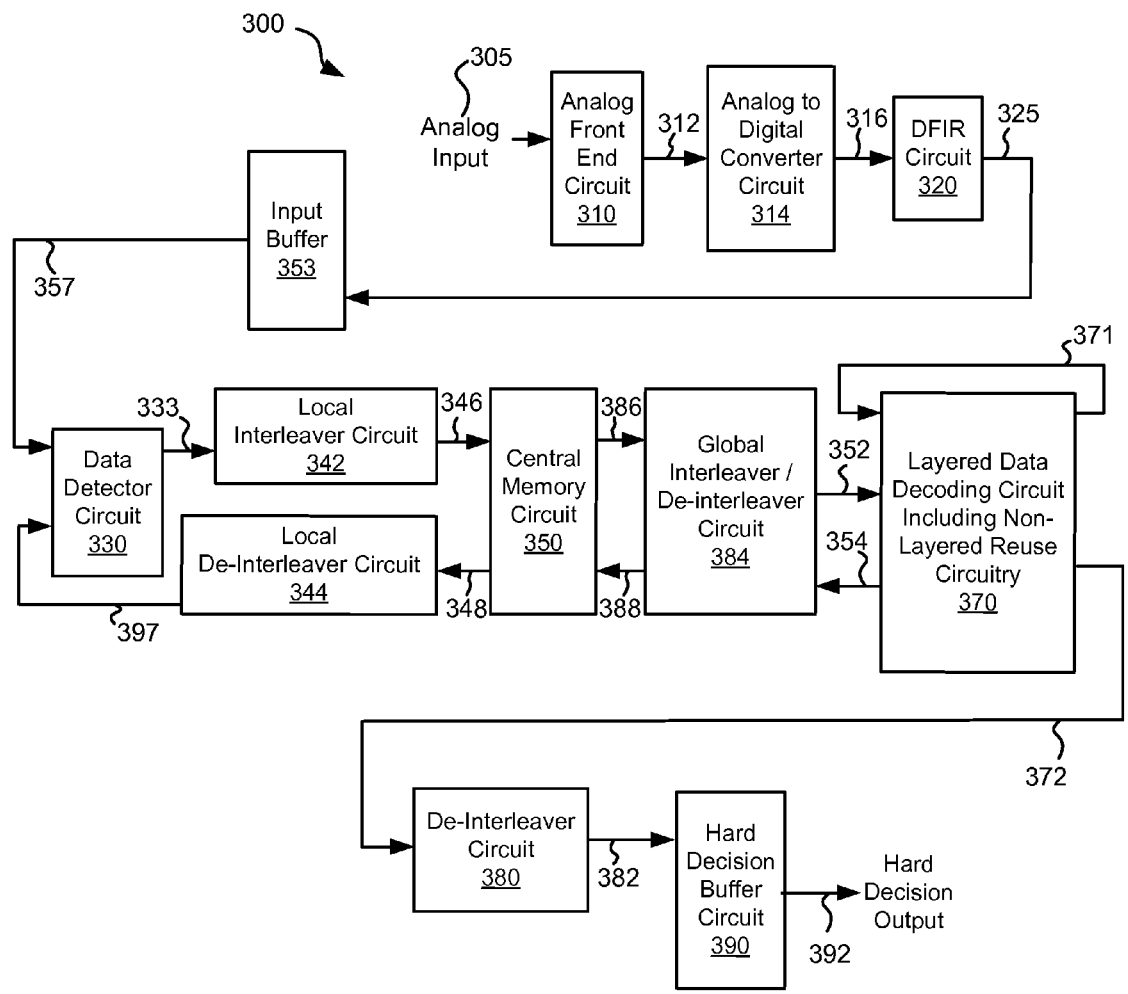
FIG. 3 shows a data processing circuit including a layered decoder and non-layered reuse circuitry in accordance with some embodiments of the present invention.

FIG. 3 shows a data processing circuit 300 including a layered decoder and non-layered reuse circuitry 370 in accordance with some embodiments of the present invention. Data processing circuit 300 includes an analog front end circuit 310 that receives an analog signal 305. Analog front end circuit 310 processes analog signal 305 and provides a processed analog signal 312 to an analog to digital converter circuit 314. Analog front end circuit 310 may include, but is not limited to, an analog filter and an amplifier circuit as are known in the art. Based upon the disclosure provided herein, one of ordinary skill in the art will recognize a variety of circuitry that may be included as part of analog front end circuit 310. In some cases, analog signal 305 is derived from a read/write head assembly (not shown) that is disposed in relation to a storage medium (not shown). In other cases, analog signal 305 is derived from a receiver circuit (not shown) that is operable to receive a signal from a transmission medium (not shown). The transmission medium may be wired or wireless. Based upon the disclosure provided herein, one of ordinary skill in the art will recognize a variety of source from which analog input 305 may be derived.

Analog to digital converter circuit 314 converts processed analog signal 312 into a corresponding series of digital samples 316. Analog to digital converter circuit 314 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 316 are provided to an equalizer circuit 320. Equalizer circuit 320 applies an equalization algorithm to digital samples 316 to yield an equalized output 325. In some embodiments of the present invention, equalizer circuit 320 is a digital finite impulse response filter circuit as are known in the art. It may be possible that equalized output 325 may be received directly from a storage device in, for example, a solid state storage system. In such cases, analog front end circuit 310, analog to digital converter circuit 314 and equalizer circuit 320 may be eliminated where the data is received as a digital data input. Equalized output 325 is stored to an input buffer 353 that includes sufficient memory to maintain a number of codewords until processing of that codeword is completed through a data detector circuit 330 and a layered decoder and non-layered reuse circuitry 370 including, where warranted, multiple global iterations (passes through both data detector circuit 330 and layered decoder and non-layered reuse circuitry 370) and/or local iterations (passes through layered decoder and non-layered reuse circuitry 370 during a given global iteration). An output 357 is provided to data detector circuit 330.

Data detector circuit 330 may be a single data detector circuit or may be two or more data detector circuits operating in parallel on different codewords. Whether it is a single data detector circuit or a number of data detector circuits operating in parallel, data detector circuit 330 is operable to apply a data detection algorithm to a received codeword or data set. In some embodiments of the present invention, data detector circuit 330 is a Viterbi algorithm data detector circuit as are known in the art. In other embodiments of the present invention, data detector circuit 330 is a maximum a posteriori data detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. In some cases, one data detector circuit included in data detector circuit 330 is used to apply the data detection algorithm to the received codeword for a first global iteration applied to the received codeword, and another data detector circuit included in data detector circuit 330 is operable apply the data detection algorithm to the received codeword guided by a decoded output accessed from a central memory circuit 350 on subsequent global iterations.

Upon completion of application of the data detection algorithm to the received codeword on the first global iteration, data detector circuit 330 provides a detector output 333. Detector output 333 includes soft data. As used herein, the phrase "soft data" is used in its broadest sense to mean reliability data with each instance of the reliability data indicating a likelihood that a corresponding bit position or group of bit positions has been correctly detected. In some embodiments of the present invention, the soft data or reliability data is log likelihood ratio data as is known in the art. Detector output 333 is provided to a local interleaver circuit 342. Local interleaver circuit 342 is operable to shuffle sub-portions (i.e., local chunks) of the data set included as detected output and provides an interleaved codeword 346 that is stored to central memory circuit 350. Interleaver circuit 342 may be any circuit known in the art that is capable of shuffling data sets to yield a re-arranged data set. Interleaved codeword 346 is stored to central memory circuit 350.

Figure 4:
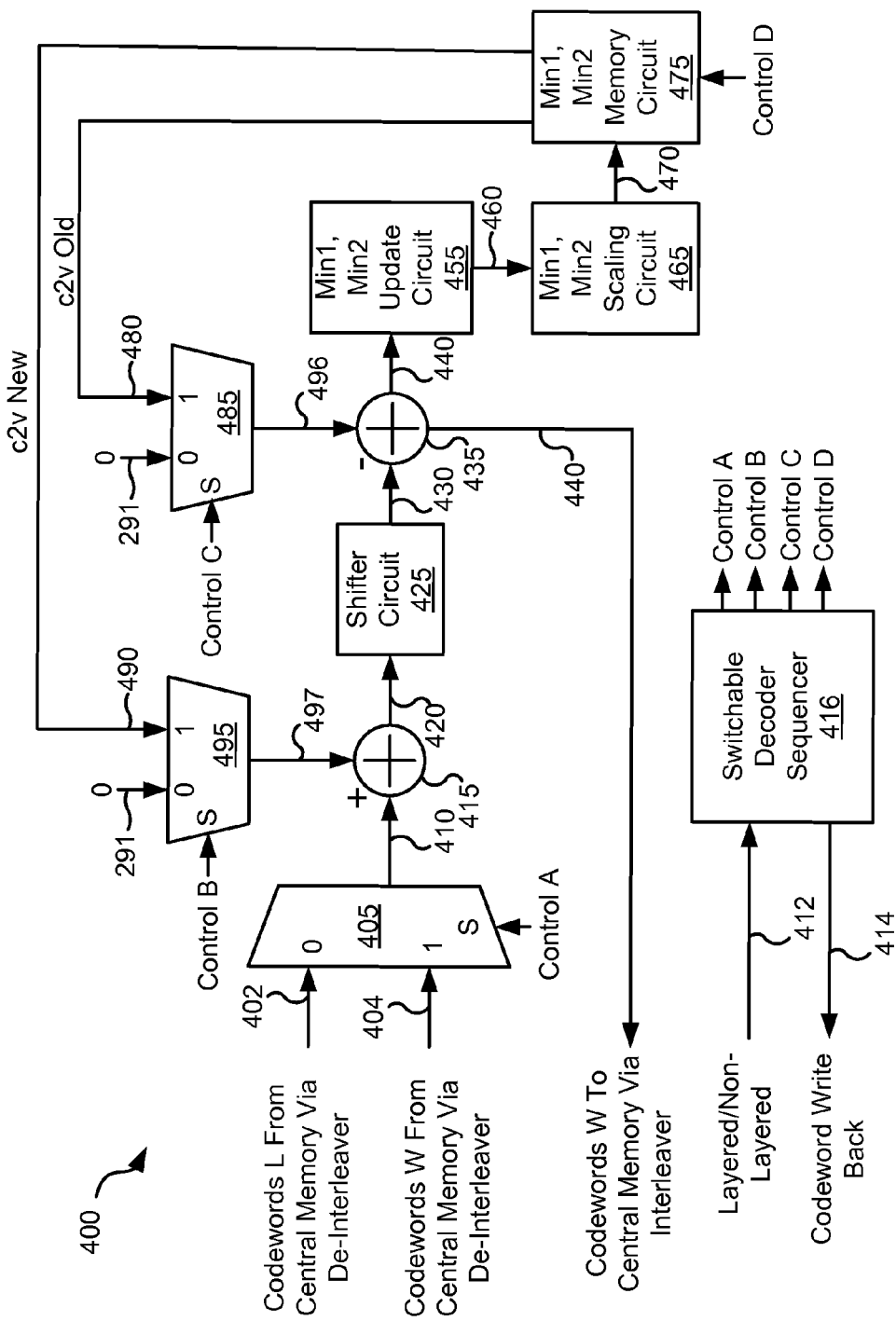
FIG. 4 shows one implementation of a layered data decoder circuit including non-layered reuse circuitry in accordance with various embodiments of the present invention.

Once layered decoder and non-layered reuse circuitry 370 is available, a previously stored interleaved codeword 346 is accessed from central memory circuit 350 as a stored codeword 386 and globally interleaved by a global interleaver/de-interleaver circuit 384. Global interleaver/de-interleaver circuit 384 may be any circuit known in the art that is capable of globally rearranging codewords. Global interleaver/De-interleaver circuit 384 provides a decoder input 352 into layered decoder and non-layered reuse circuitry 370. In some embodiments of the present invention, the data decode algorithm is a layered low density parity check algorithm as are known in the art. In other embodiments of the present invention, the data decode algorithm is a non-layered low density parity check algorithm as are known in the art. Both the layered and non-layered data decoding algorithms are implemented using common circuitry. One implementation of layered decoder and non-layered reuse circuitry 370 is shown in FIG. 4 below. Based upon the disclosure provided herein, one of ordinary skill in the art will recognize other decode algorithms that may be used in relation to different embodiments of the present invention. Layered decoder and non-layered reuse circuitry 370 applies a selected data decode algorithm to decoder input 352 to yield a decoded output 371. In cases where another local iteration (i.e., another pass trough data decoder circuit 370) is desired, layered decoder and non-layered reuse circuitry 370 re-applies the data decode algorithm to decoder input 352 guided by decoded output 371. This continues until either a maximum number of local iterations is exceeded or decoded output 371 converges (i.e., completion of standard processing).

Where decoded output 371 fails to converge (i.e., fails to yield the originally written data set) and a number of local iterations through layered decoder and non-layered reuse circuitry 370 exceeds a threshold, the resulting decoded output is provided as a decoded output 354 back to central memory circuit 350 where it is stored awaiting another global iteration through a data detector circuit included in data detector circuit 330. Prior to storage of decoded output 354 to central memory circuit 350, decoded output 354 is globally de-interleaved to yield a globally de-interleaved output 388 that is stored to central memory circuit 350. The global de-interleaving reverses the global interleaving earlier applied to stored codeword 386 to yield decoder input 352. When a data detector circuit included in data detector circuit 330 becomes available, a previously stored de-interleaved output 388 is accessed from central memory circuit 350 and locally de-interleaved by a de-interleaver circuit 344. De-interleaver circuit 344 re-arranges decoder output 348 to reverse the shuffling originally performed by interleaver circuit 342. A resulting de-interleaved output 397 is provided to data detector circuit 330 where it is used to guide subsequent detection of a corresponding data set previously received as equalized output 325.

Alternatively, where the decoded output converges (i.e., yields the originally written data set), the resulting decoded output is provided as an output codeword 372 to a de-interleaver circuit 380 that rearranges the data to reverse both the global and local interleaving applied to the data to yield a de-interleaved output 382. De-interleaved output 382 is provided to a hard decision buffer circuit 390 that arranges the received codeword along with other previously received codewords in an order expected by a requesting host processor. The resulting output is provided as a hard decision output 392.

Turning to FIG. 4, one implementation of a layered data decoder circuit including non-layered reuse circuitry 400 is shown in accordance with various embodiments of the present invention. Layered data decoder circuit including non-layered reuse circuitry 400 includes a multiplexer circuit 405 that receives codewords L from a central memory 402 and codewords W from the central memory 404. Where layered data decoder circuit including non-layered reuse circuitry 400 is used in relation to data processing circuit 300, codewords L from the central memory 402 and codewords W from the central memory 404 are accessed from central memory circuit 350 via global interleaver/de-interleaver circuit 384. Based upon a control A signal, multiplexer 405 provides a data input 410 selected as one of codewords L from the central memory 402 or codewords W from the central memory 404. Codewords L from the central memory 402 correspond to new data received from the channel, and codewords W from the central memory 404 correspond to a result from a previous local iteration of the data decoding algorithm.

A multiplexer 495 selects between either a new c2v (i.e., check node to variable node) message 490 or a zero value 291 as a summation input 497 based upon a control B signal. Summation input 497 and data input 410 are each provided to a summation circuit 415 where they are added together to yield a first sum 420. First sum 420 is provided to a shifter circuit 425 that is operable to rotate a quasi cyclic input to yield a shifted output 430. Shifter circuit 425 may be any circuit known in the art that is capable of shifting codewords including quasi-cyclic circulants. A multiplexer 485 selects between either an old c2v (i.e., check node to variable node) message 480 or zero value 291 as a summation input 496 based upon a control C signal. Summation input 496 and shifted output 430 are each provided to a summation circuit 435 where summation input 496 is subtracted from shifted output 430 to yield a second sum 440. Second sum is provided back to the central memory (not shown) as codewords W to central memory via an interleaver. This replaces the previous instance of codewords W for the currently processing codeword.

In addition, second sum 440 is provided to a min 1, min 2 update circuit 455. Min 1, min 2 update circuit 455 selects the minimum distance (i.e., min 1) and the next minimum distance (i.e., min 2) to the next trellis node. Min 1, min 2 update circuit 455 may be any circuit known in the art for generating the first and second minimum distance values. Based upon the disclosure provided herein, one of ordinary skill in the art will recognize a variety of implementations of min 1, min 2 update circuit 455 that may be used in relation to different embodiments of the present invention.

Min 1, min 2 update circuit 455 provides the generated min 1 and min 2 values as an output 460 to a min 1, min 2 scaling circuit 465. Min 1, min 2 scaling circuit 465 scales output 460 to yield scaled min 1, min 2 values 470 that are provided to a min 1, min 2 memory circuit 475. Min 1, min 2 scaling circuit 465 may be any circuit known in the art that is capable of applying a scalar to a received value to yield a scaled value. In one particular embodiment of the present invention, min 1, min 2 scaling circuit 465 is a multiplier circuit. Min 1, min 2 memory circuit 475 retains a previous instances of scaled min 1, min 2 values 470 as c2v old message 480, and the current instance of scaled min 1, min 2 values 475 as c2v new message 490. The storage of min 1, min 2 memory circuit 475 is updated based upon assertion of a control D signal.

A switchable decoder sequencer 416 controls the sequencing of control A signal, control B signal, control C signal, and control D signal, and a codeword write back 414 depending upon whether layered decoding or non-layered decoding is selected via a layered/non-layered selector signal 412.

Figure 5A:
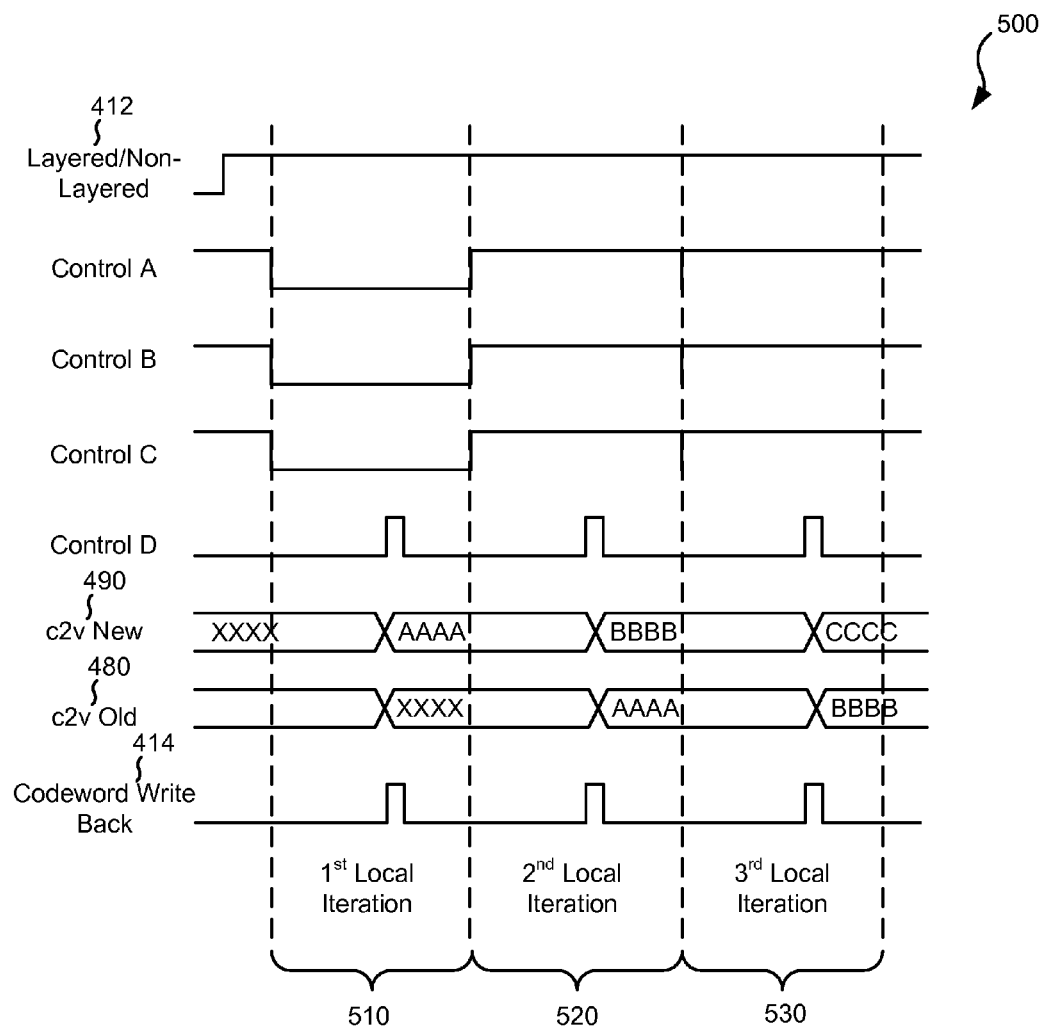
FIG. 5a is an example timing diagram showing an operation of the circuit of claim 4 as a layered decoder.
Figure 5B:
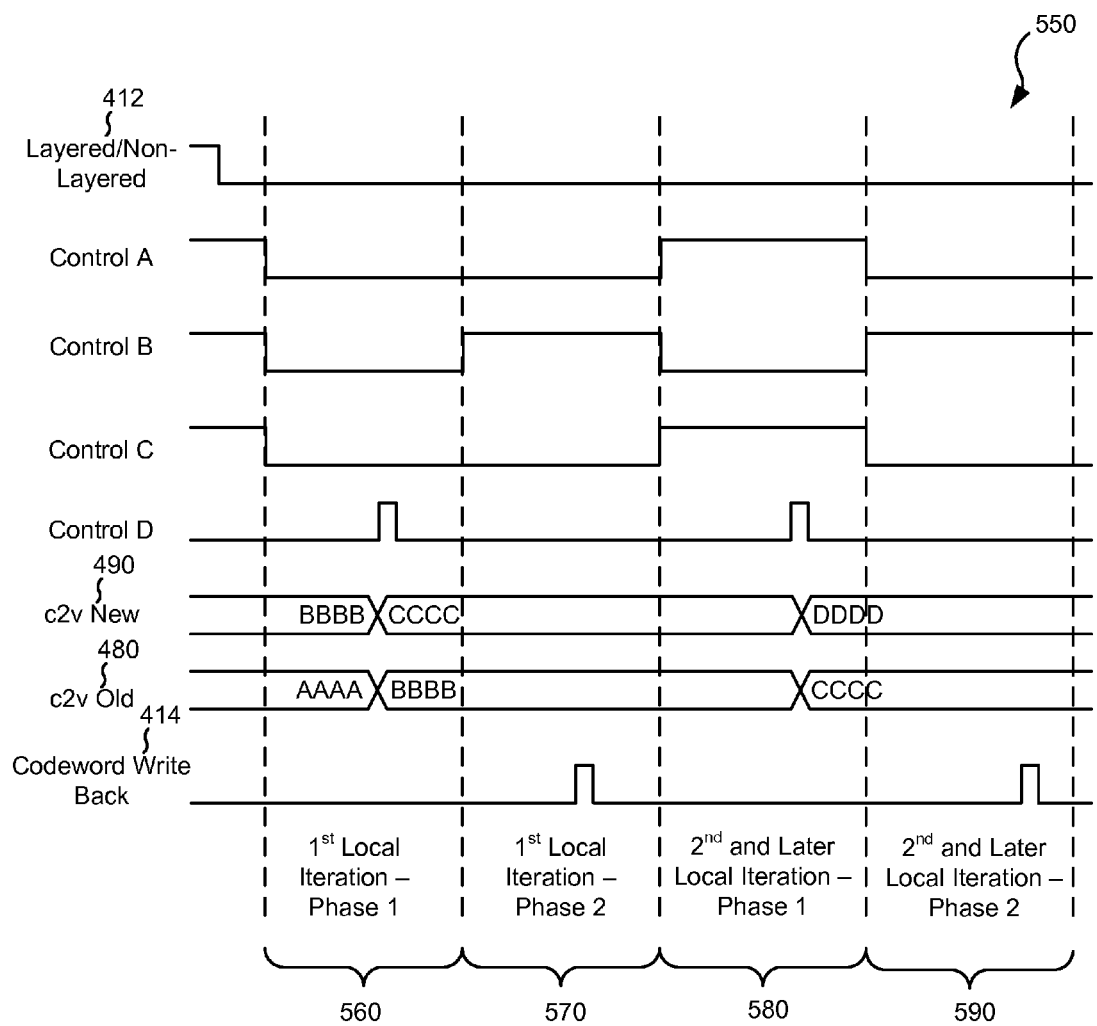
FIG. 5b is an example timing diagram showing an operation of the circuit of claim 4 as a non-layered decoder.

Turning to FIGS. 5a-5b, timing diagrams 500, 550 show the sequencing applied by switchable decoder sequencer 416 depending upon the selection of layered decoding or non-layered decoding via layered/non-layered selector signal 412. Turning first to FIG. 5a, application of layered decoding by switchable decoder sequencer 416 is shown via timing diagram 500. Following timing diagram 500, layered/non-layered selector signal 412 is asserted high indicating the selection of layered decoding. For a first local iteration 510 when decoding begins for a codeword recently received in the central memory, control A, control B and control C are all asserted low. This results in selection of a codeword L from the central memory as data input 410. The low assertion of control B results in the addition of zero value 291 to data input 410 by summation circuit 415, and the low assertion of control C results in the subtraction of zero value 291 from shifted output 430 by summation circuit 435. At some point after min 1, min2 update circuit 455 and min 1, min 2 scaling circuit 465 have completed update of scaled min 1, min 2 values 470, control D is asserted causing min 1, min 2 memory circuit 475 to retain a previous instances of scaled min 1, min 2 values 470 as c2v old message 480, and the current instance of scaled min 1, min 2 values 475 as c2v new message 490. In addition, codeword write back 414 is asserted causing second sum 440 to be interleaved and stored back to the central memory.

During a second and later local iteration (e.g., second local iteration 520, local iteration 530), control A, control B and control C are all asserted high. This results in selection of a codeword W from the central memory as data input 410. The high assertion of control B results in the addition of c2v new message 490 to data input 410 by summation circuit 415, and the high assertion of control C results in the subtraction of c2v old message 480 from shifted output 430 by summation circuit 435. At some point after min 1, min2 update circuit 455 and min 1, min 2 scaling circuit 465 have completed update of scaled min 1, min 2 values 470, control D is asserted causing min 1, min 2 memory circuit 475 to retain a previous instances of scaled min 1, min 2 values 470 as c2v old message 480, and the current instance of scaled min 1, min 2 values 475 as c2v new message 490. In addition, codeword write back 414 is asserted causing second sum 440 to be interleaved and stored back to the central memory.

Turning first to FIG. 5b, application of non-layered decoding by switchable decoder sequencer 416 is shown via timing diagram 550. Following timing diagram 550, layered/non-layered selector signal 412 is asserted low indicating the selection of non-layered decoding. A first local iteration is accomplished in two phases (i.e., a first local iteration first phase 560, and a first local iteration second phase 570), and a second local iteration (and the third and later local iterations) is accomplished in two phases (i.e., a second local iteration first phase 580, and a second local iteration second phase 580). Such dual phase processing allow for reuse of the layered decoder circuitry to achieve a non-layered result.

For first local iteration, first phase 560 when decoding begins for a codeword recently received in the central memory, control A, control B and control C are all asserted low. This results in selection of a codeword L from the central memory as data input 410. The low assertion of control B results in the addition of zero value 291 to data input 410 by summation circuit 415, and the low assertion of control C results in the subtraction of zero value 291 from shifted output 430 by summation circuit 435. At some point after min 1, min2 update circuit 455 and min 1, min 2 scaling circuit 465 have completed update of scaled min 1, min 2 values 470, control D is asserted causing min 1, min 2 memory circuit 475 to retain a previous instances of scaled min 1, min 2 values 470 as c2v old message 480, and the current instance of scaled min 1, min 2 values 475 as c2v new message 490. Of note, during first local iteration, first phase 560 the codeword is not prepared for write back to the central memory. As such, codeword write back 414 is not asserted during first local iteration, first phase 560.

Subsequently, during first local iteration, second phase 570, control A is asserted low, control B is asserted high, and control C is asserted low. This results in re-selection of codeword L from the central memory as data input 410. The high assertion of control B results in the addition of c2v new message 490 to data input 410 by summation circuit 415. The c2v new message 490 was updated during first local iteration, first phase 560. The low assertion of control C results in the subtraction of zero value 291 from shifted output 430 by summation circuit 435. As c2v new message 490 was updated during first local iteration, first phase 560, control D is not asserted during first local iteration, second phase 570. Sometime before the completion of first local iteration, second phase 570, codeword write back 414 is asserted causing second sum 440 to be interleaved and stored back to the central memory.

Later during second local iteration, first phase 580, control A is asserted high, control B is asserted low, and control C is asserted high. This results in selection of codeword W (the previous write back result) from the central memory as data input 410. The low assertion of control B results in the addition of zero value 291 to data input 410 by summation circuit 415. The high assertion of control C results in the subtraction of c2v old message 480 from shifted output 430 by summation circuit 435. At some point after min 1, min2 update circuit 455 and min 1, min 2 scaling circuit 465 have completed update of scaled min 1, min 2 values 470, control D is asserted causing min 1, min 2 memory circuit 475 to retain a previous instances of scaled min 1, min 2 values 470 as c2v old message 480, and the current instance of scaled min 1, min 2 values 475 as c2v new message 490. Of note, during second local iteration, first phase 580 the codeword is not prepared for write back to the central memory. As such, codeword write back 414 is not asserted during second local iteration, first phase 580.

Subsequently, during second local iteration, second phase 590, control A is asserted low, control B is asserted high, and control C is asserted low. This results in re-selection of codeword L from the central memory as data input 410. The high assertion of control B results in the addition of c2v new message 490 to data input 410 by summation circuit 415. The c2v new message 490 was updated during second local iteration, first phase 580. The low assertion of control C results in the subtraction of zero value 291 from shifted output 430 by summation circuit 435. As c2v new message 490 was updated during first local iteration, first phase 560, control D is not asserted during second local iteration, second phase 590. Sometime before the completion of second local iteration, second phase 590, codeword write back 414 is asserted causing second sum 440 to be interleaved and stored back to the central memory.

Figure 6A:
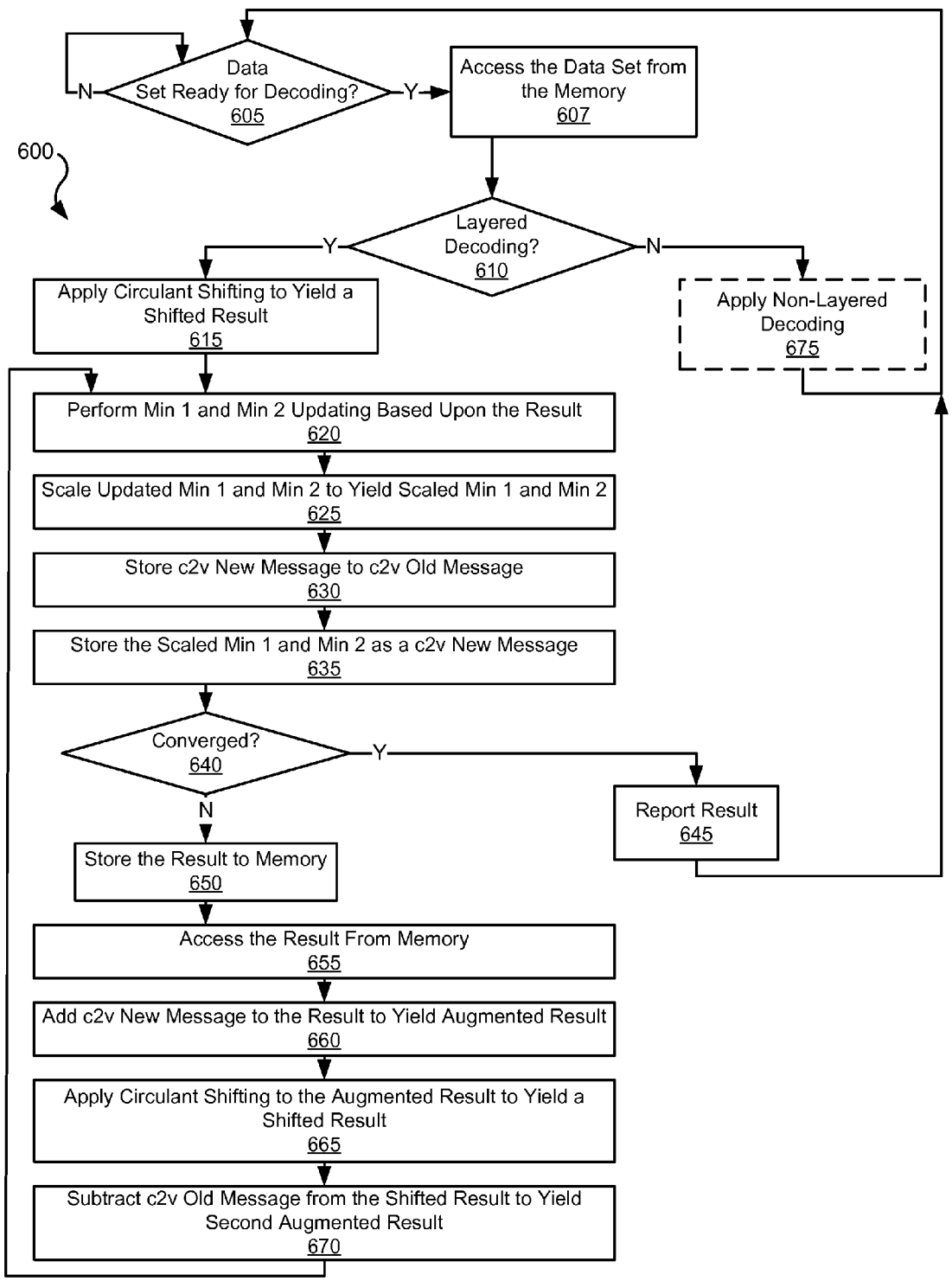
FIGS. 6a-6b are flow diagrams showing a method for performing data decoding using a combination layered/non-layered data decoder circuit in accordance with one or more embodiments of the present invention.
Figure 6B:
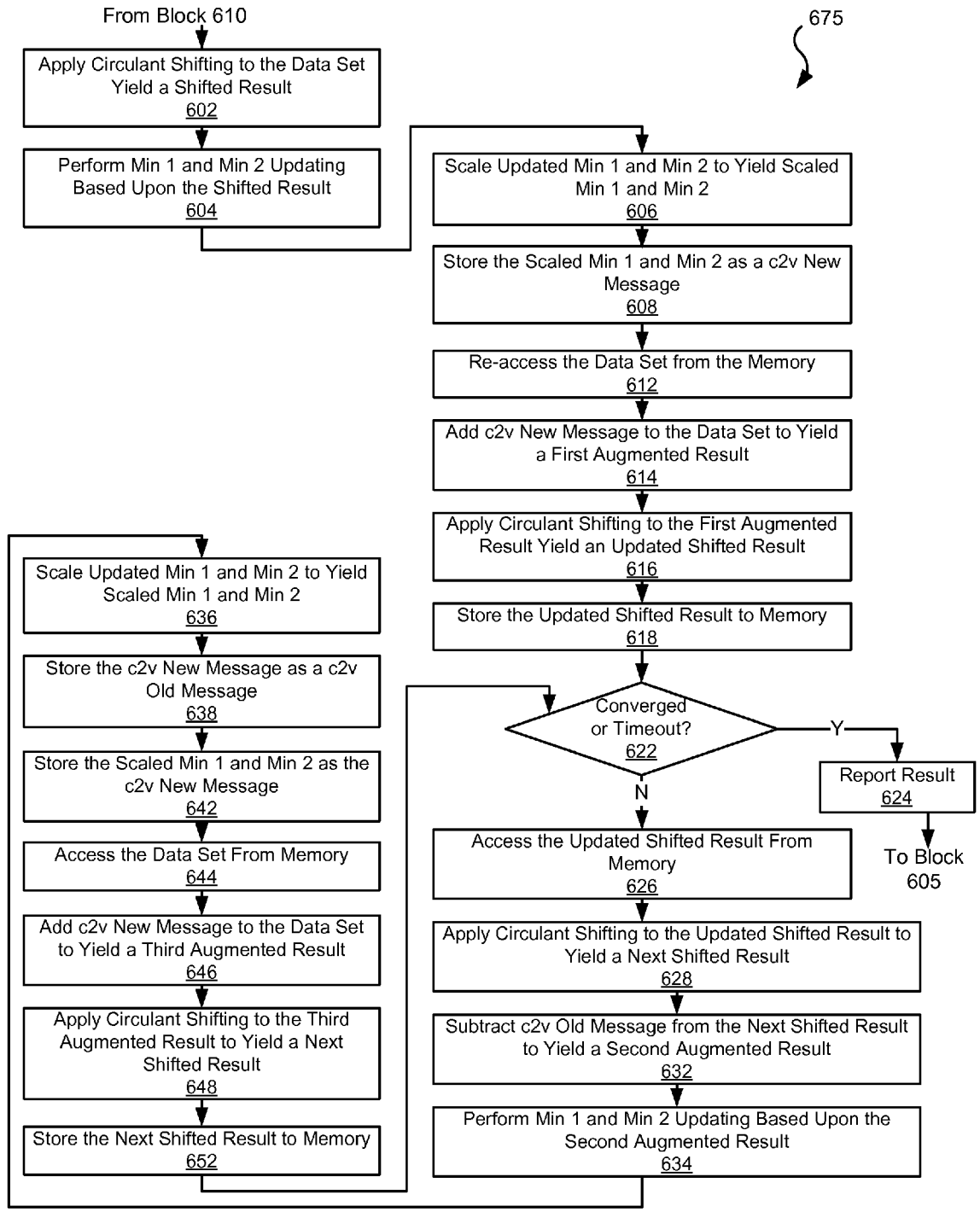

Turing to FIGS. 6a-6b, flow diagrams 600, 675 graphically show method for performing data decoding using a combination layered/non-layered data decoder circuit in accordance with one or more embodiments of the present invention. Following flow diagram 600 of FIG. 6a, it is determined whether a data set is ready for processing by a data decoder circuit (block 605). A data set may become available after processing through an upstream data detector circuit has completed. Where a data set is available for processing (block 605), the data set is accessed from memory (block 607). This access from memory may include interleaving or de-interleaving depending upon the status of the available data set. It is then determined whether layered decoding is selected (block 610).

Where layered decoding is selected (block 610), circulant shifting is applied to the accessed data set to yield a shifted result (block 615). Min 1 and min 2 updating is then performed on the shifted result (block 620). This Min 1 and min 2 includes selecting the two shortest distances between trellis nodes. The resulting Min 1 and Min 2 values are scaled to yield scaled Min 1 and Min 2 values (block 625). This scaling may include, but is not limited to, multiplying the Min 1 and Min 2 values by a scalar value to yield the scaled Min 1 and Min 2 values. A previously calculated c2v new message (i.e., previous values of scaled Min 1 and Min 2) is stored as a c2v old message (block 630), and the scaled Min 1, Min 2 values are stored as the c2v new message (block 635). This concludes the first local iteration of the data set through the data decoder circuit.

It is determined whether the first local iteration converged (i.e., generated the desired result) or a time out condition (e.g., exceeding a number of allowed local iterations) occurred (block 640). Where the data decoding converged or a timeout condition occurred (block 640), the final result is reported (block 645). Alternatively, where neither the data decoding converged nor a timeout condition has been met (block 640), the result is stored back to the memory to await further processing in a subsequent local iteration (block 650). The result is later accessed from the memory in preparation for performing a subsequent local iteration (block 655).

The c2v new message is added to the accessed result to yield an augmented result (block 660). Circulant shifting is applied to the augmented result to yield a shifted result (block 665), and the c2v old message is subtracted from the shifted result to yield a second augmented result (block 670). Min 1 and min 2 updating is then performed on the shifted result (block 620). Again, this Min 1 and min 2 includes selecting the two shortest distances between trellis nodes. The resulting Min 1 and Min 2 values are scaled to yield scaled Min 1 and Min 2 values (block 625). This scaling may include, but is not limited to, multiplying the Min 1 and Min 2 values by a scalar value to yield the scaled Min 1 and Min 2 values. A previously calculated c2v new message (i.e., previous values of scaled Min 1 and Min 2) is stored as a c2v old message (block 630), and the scaled Min 1, Min 2 values are stored as the c2v new message (block 635). This concludes the second local iteration of the data set through the data decoder circuit. The processes of blocks 640, 650, 655, 660, 665, 670, 620, 625, 630, 635 is repeated until either the data decoding converges or a timeout condition occurs.

Alternatively, where layered decoding is not desired (block 610, non-layered decoding is applied (block 675). The details of block 675 are shown in a flow diagram of the same number on FIG. 6*b*. Following flow diagram 675 of FIG. 6*b*, circulant shifting is applied to the accessed data set to yield a shifted result (block 602). Min 1 and min 2 updating is then performed on the shifted result (block 604). This Min 1 and min 2 includes selecting the two shortest distances between trellis nodes. The resulting Min 1 and Min 2 values are scaled to yield scaled Min 1 and Min 2 values (block 606). This scaling may include, but is not limited to, multiplying the Min 1 and Min 2 values by a scalar value to yield the scaled Min 1 and Min 2 values. The resulting scaled Min 1, Min 2 values are stored as a c2v new message (block 608). This concludes the first phase of the first local iteration of the data set through the data decoder circuit.

The data set is re-accessed from the memory (block 612), and the previously generated c2v new message is added to the data set to yield a first augmented result (block 614). Circulant shifting is applied to the first augmented output to yield an updated shifted result (block 616) and the updated shifted result is stored back to the memory (block 618). This concludes the second phase of the first local iteration through the data decoder circuit. It is determined whether the first local iteration converged (i.e., generated the desired result) or a time out condition (e.g., exceeding a number of allowed local iterations) occurred (block 622). Where the data decoding converged or a timeout condition occurred (block 622), the final result is reported (block 624).

Alternatively, where neither the data decoding converged nor a timeout condition has been met (block 622), the updated shifted result is accessed from the memory (block 626). Circulant shifting is applied to the accessed updated shifted result to yield a next shifted result (block 628). The previously calculated c2v old message is subtracted from the next shifted result to yield a second augmented result (block 632). Min 1 and min 2 updating is then performed on the next shifted result (block 634). This Min 1 and min 2 includes selecting the two shortest distances between trellis nodes. The resulting Min 1 and Min 2 values are scaled to yield scaled Min 1 and Min 2 values (block 636). This scaling may include, but is not limited to, multiplying the Min 1 and Min 2 values by a scalar value to yield the scaled Min 1 and Min 2 values. The current c2v new message is stored as the c2v old message (block 638), and the scaled Min 1, Min 2 values are stored as a c2v new message (block 642). This concludes the first phase of the second local iteration of the data set through the data decoder circuit.

The data set is re-accessed from the memory (block 644). The new c2v message is added to the data set to yield a third augmented result (block 646). Circulant shifting is applied to the third augmented output to yield a next shifted result (block 648) and the next shifted result is stored back to the memory (block 652). This concludes the second phase of the second local iteration through the data decoder circuit. The processes of blocks 622, 624, 626, 628, 632, 634, 636, 638, 642, 644, 646, 648, 652 are repeated for the third and later local iterations through the data decoder circuit until either the data decoding process converges or a timeout condition is met.

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the data processing system comprising:
   a data decoder circuit selectably configurable based upon a selector signal to operate as either one of:
   a layered data decoder circuit; or
   a non-layered data decoder circuit.

2. The data processing system of claim 1, wherein the layered data decoder circuit is a layered low density parity check decoder circuit, and wherein the non-layered data decoder circuit is a non-layered low density parity check decoder circuit.

3. The data processing system of claim 1, wherein the data processing system further comprises:
   a data detector circuit operable to apply a data detection algorithm to a data input to yield a decoder input, wherein the data decoder circuit applies the selected one of the layered data decoder circuit or the non-layered data decoder circuit to the decoder input to yield a decoded output.

4. The data processing system of claim 3, wherein the data detector circuit is selected from a group consisting of: a Viterbi algorithm data detector circuit, and a maximum a posteriori data detector circuit.

5. The data processing system of claim 1, wherein the data processing system is implemented as an integrated circuit.

6. The data processing system of claim 1, wherein the data processing system is incorporated in a device selected from a group consisting of: a storage device, and a data transmission device.

7. The data processing system of claim 1, wherein the data decoder circuit comprises:
   a first selector circuit operable to select between a first codeword and a second codeword to provide a decoder input, wherein the second codeword was processed by a preceding local iteration through the data decoder circuit;
   a second selector circuit operable to select between a first value and a check node to variable node new message as a first summation input;
   a third selector circuit operable to select between a second value and a check node to variable node old message as a second summation input; and
   wherein selectably configuring the data decoder circuit is controlled at least in part based upon controlling selections by the first selector circuit, the second selector circuit, and the third selector circuit.

8. The data processing system of claim 7, wherein the first value and the second value are zero.

9. The data processing system of claim 7, wherein the data decoder circuit further comprises:
   a first summation circuit operable to add the decoder input to the first summation input to yield a first sum;
   a shifter circuit operable to apply a circulant shift to the first sum to yield a shifted output; and
   a second summation circuit operable to subtract the second summation input from the shifted output.

10. The data processing system of claim 9, wherein the data decoder circuit further comprises:
   a check node to variable node updating circuit operable to update the check node to variable node old message and the check node to variable node new message.

11. A data processing system, the data processing system comprising:
   a dual pass data decoder circuit operable to:
      access a data set from a memory for a first pass through the dual pass data decoder circuit;
      update a check node to variable node message based at least in part on the data set during the first pass;
      re-access the data set from the memory for a second pass through the dual pass data decoder circuit; and
      apply the check node to variable node message during the second pass to yield an output; and
   wherein the dual pass data decoder circuit includes:
      a first selector circuit operable to select between a first codeword and a second codeword to provide a decoder input, wherein the second codeword was processed by a preceding local iteration through the data decoder circuit;
      a second selector circuit operable to select between a first value and a check node to variable node new message as a first summation input; and
      a third selector circuit operable to select between a second value and a check node to variable node old message as a second summation input.

12. The data processing system of claim 11, wherein the first value and the second value are zero.

13. The data processing system of claim 11, wherein the data decoder circuit further comprises:
   a first summation circuit operable to add the decoder input to the first summation input to yield a first sum;
   a shifter circuit operable to apply a circulant shift to the first sum to yield a shifted output; and
   a second summation circuit operable to subtract the second summation input from the shifted output.

14. The data processing system of claim 13, wherein the data decoder circuit further comprises:
   a check node to variable node updating circuit operable to update the check node to variable node old message and the check node to variable node new message.

15. The data processing system of claim 14, wherein the data decoder circuit is operable to:
   select the first codeword via the first selector circuit as the decoder input during the first pass and the second pass;
   select the first value via the second selector circuit as the first summation input during the first pass;
   select the check node to variable node new message via the second selector circuit as the first summation input during the second pass; and
   select the second value via the third selector circuit as the second summation input during the first pass and the second pass.

16. The data processing system of claim 14, wherein the data decoder circuit is operable to:
   select the second codeword via the first selector circuit as the decoder input during the first pass;
   select the first codeword via the first selector circuit as the decoder input during the second pass;
   select the first value via the second selector circuit as the first summation input during the first pass;
   select the check node to variable node new message via the second selector circuit as the first summation input during the second pass;
   select the check node to variable node old message via the third selector circuit as the second summation input during the first pass; and
   select the second value via the third selector circuit as the second summation input during the second pass.

17. The data processing system of claim 11, wherein the system is implemented as an integrated circuit.

18. The data processing system of claim 11, wherein the data processing system is incorporated in a device selected from a group consisting of: a storage device, and a data transmission device.

19. A method for data processing, the method comprising:
   providing a data decoder circuit selectably configurable to operate as one of:
      a layered data decoder circuit; and
      a non-layered data decoder circuit;
   configuring the data decoder circuit to operate as a layered data decoder circuit;
   applying a layered data decoding algorithm to a data set using the layered data decoder circuit;
   determining a failure of convergence of the layered data decoder circuit;
   re-configuring the data decoder circuit to operate as a non-layered data decoder circuit; and
   applying a non-layered data decoding algorithm to a data set using the non-layered data decoder circuit.

20. The method of claim 19, wherein the layered data decoder circuit is a layered low density parity check decoder circuit, and wherein the non-layered data decoder circuit is a non-layered low density parity check decoder circuit.

* * * * *